US009202910B2

United States Patent
Mauder et al.

(10) Patent No.: US 9,202,910 B2
(45) Date of Patent: Dec. 1, 2015

(54) LATERAL POWER SEMICONDUCTOR DEVICE AND METHOD FOR MANUFACTURING A LATERAL POWER SEMICONDUCTOR DEVICE

(71) Applicant: Infineon Technologies Austria AG, Villach (AT)

(72) Inventors: Anton Mauder, Kolbermoor (DE); Norbert Thyssen, Dresden (DE); Rolf Weis, Dresden (DE)

(73) Assignee: Infineon Technologies Austria AG, Villach (AT)

( * ) Notice: Subject to any disclaimer, the term of this patent is extended or adjusted under 35 U.S.C. 154(b) by 221 days.

(21) Appl. No.: 13/873,994

(22) Filed: Apr. 30, 2013

(65) Prior Publication Data
US 2014/0319610 A1    Oct. 30, 2014

(51) Int. Cl.
| H01L 29/78 | (2006.01) |
| H01L 29/06 | (2006.01) |
| H01L 29/66 | (2006.01) |
| H01L 29/861 | (2006.01) |

(52) U.S. Cl.
CPC ........ *H01L 29/7816* (2013.01); *H01L 29/0696* (2013.01); *H01L 29/66681* (2013.01); *H01L 29/8611* (2013.01)

(58) Field of Classification Search
CPC ............ H01L 29/8611; H01L 29/7816; H01L 29/66681; H01L 29/0696
See application file for complete search history.

(56) References Cited

U.S. PATENT DOCUMENTS

| 6,858,895 | B2 | 2/2005 | Feldtkeller et al. |
| 7,002,211 | B2 | 2/2006 | Onishi et al. |
| 7,777,278 | B2 | 8/2010 | Hirler et al. |
| 7,859,047 | B2 | 12/2010 | Kraft et al. |
| 8,030,703 | B2 | 10/2011 | Kotz et al. |
| 2007/0290257 | A1 | 12/2007 | Kraft et al. |
| 2008/0064168 | A1 | 3/2008 | Kraft et al. |
| 2008/0197441 | A1* | 8/2008 | Mauder et al. ................ 257/487 |
| 2008/0211019 | A1 | 9/2008 | Kotz et al. |
| 2009/0057754 | A1 | 3/2009 | Kraft et al. |
| 2009/0078971 | A1* | 3/2009 | Treu et al. .................... 257/263 |
| 2011/0204436 | A1 | 8/2011 | Kraft et al. |

FOREIGN PATENT DOCUMENTS

| DE | 102006043485 B4 | 11/2008 |
| DE | 102006009942 B4 | 2/2012 |
| WO | 2007012490 A2 | 2/2007 |

* cited by examiner

*Primary Examiner* — Hrayr A Sayadian
(74) *Attorney, Agent, or Firm* — Murphy, Bilak & Homiller, PLLC

(57) ABSTRACT

A lateral power semiconductor device includes a semiconductor body having a first surface and a second opposite surface, a first main electrode, a second main electrode, a plurality of switchable semiconductor cells and at least one curved semiconductor portion. The first main electrode includes at least two sections and is arranged on the first surface. The second main electrode is arranged on the first surface and between the two sections of the first main electrode. The plurality of switchable semiconductor cells is arranged between a respective one of the two sections of the first main electrode and the second main electrode and is configured to provide a controllable conductive path between the first main electrode and the second main electrode. The curved semiconductor portion is between the first main electrode and the second main electrode and has increasing doping concentration from the first main electrode to the second main electrode.

27 Claims, 8 Drawing Sheets

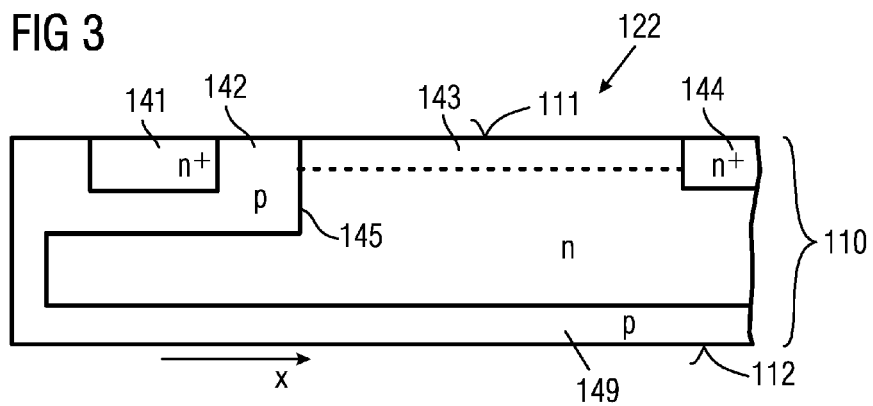
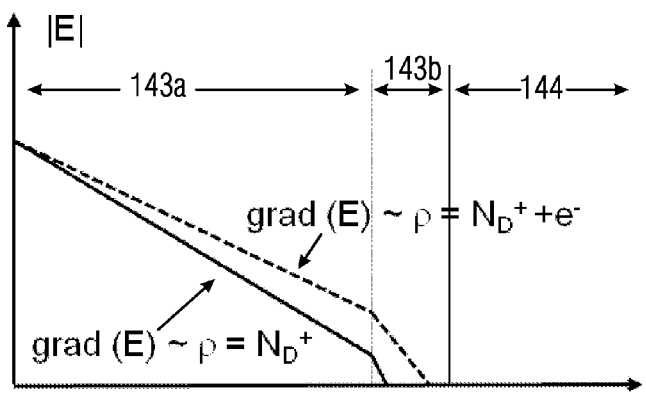
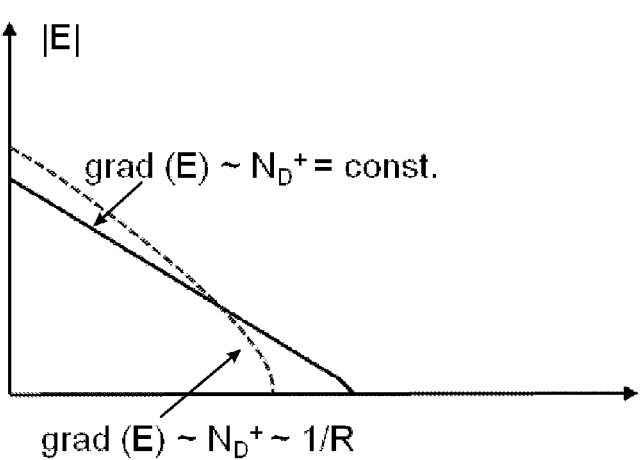

B-B

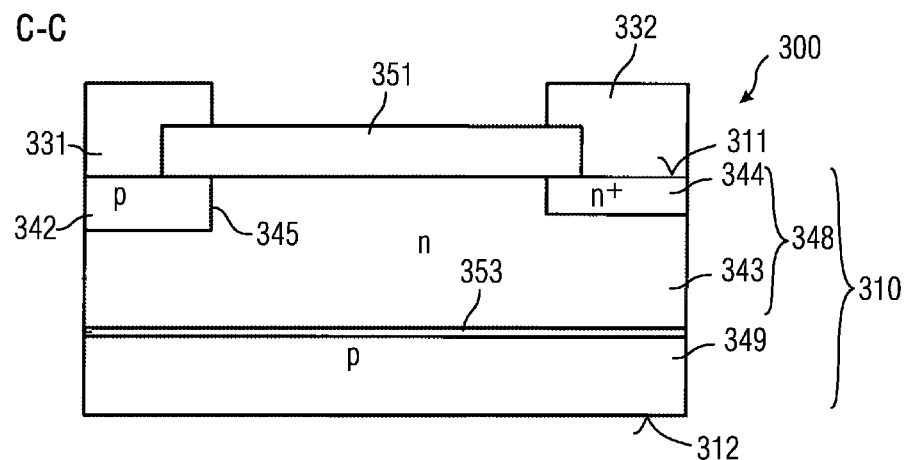
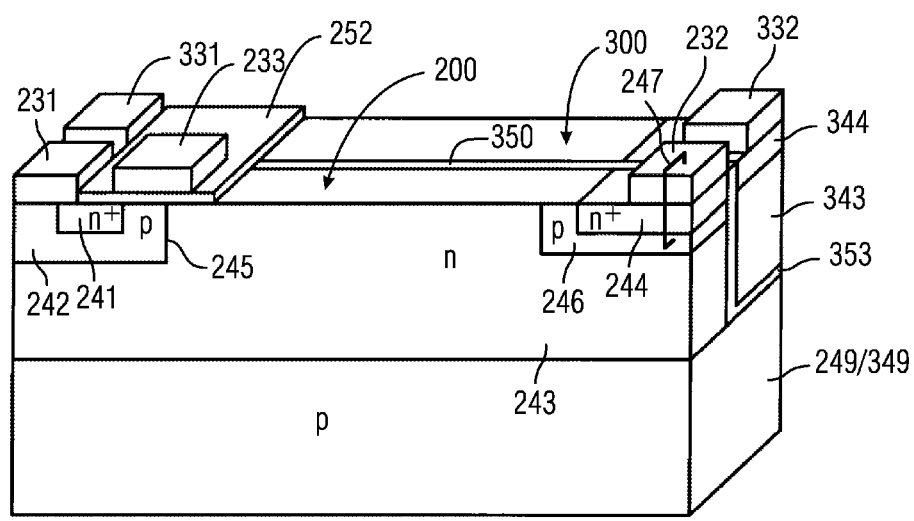

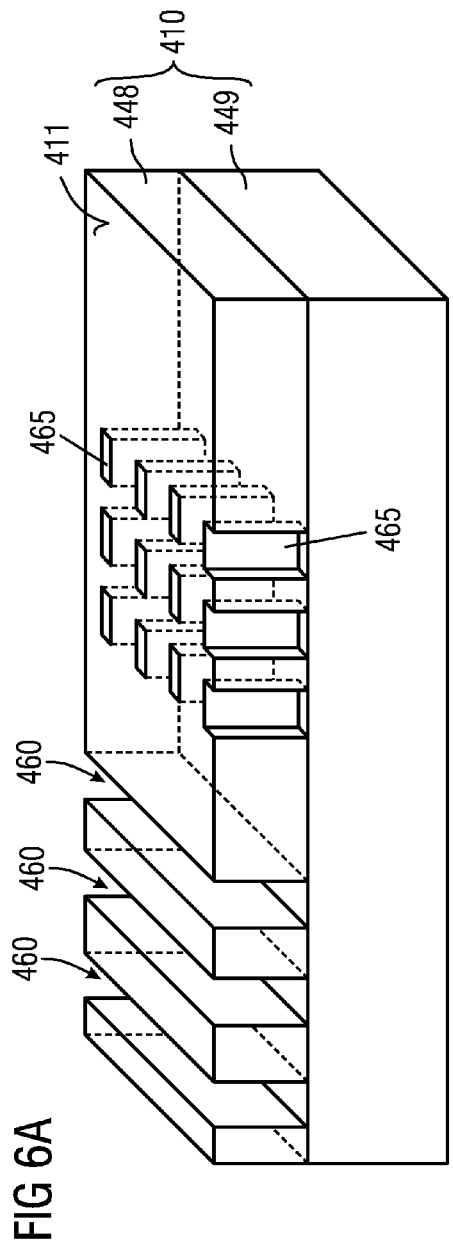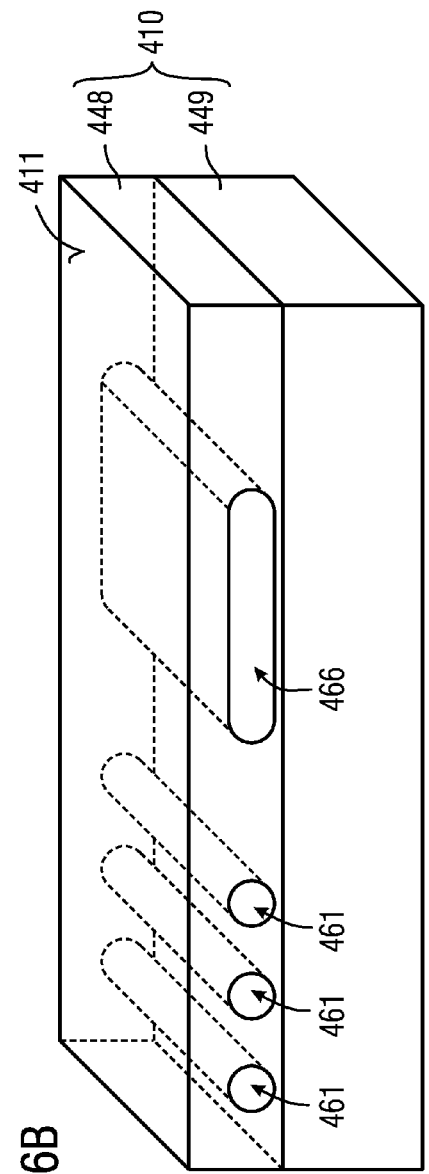
FIG 6A
FIG 6B

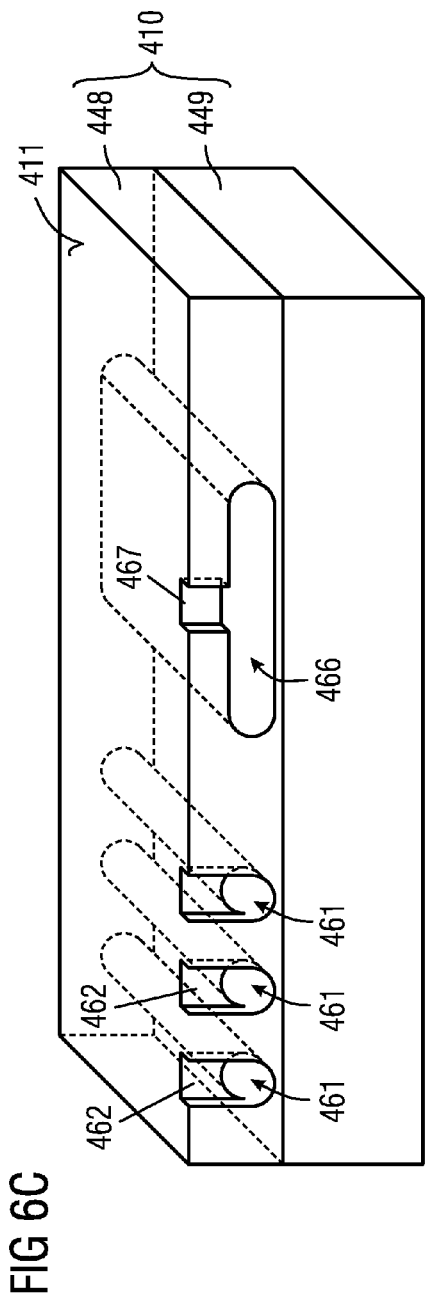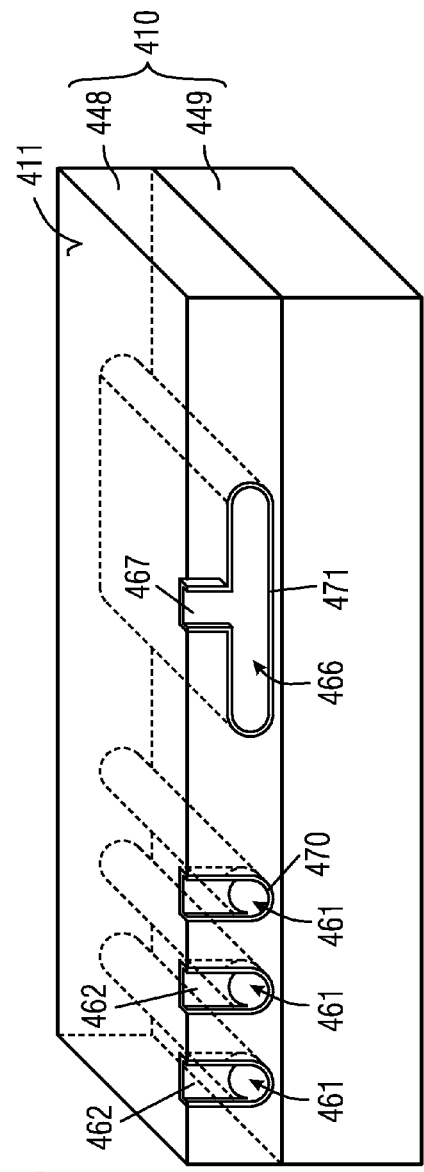

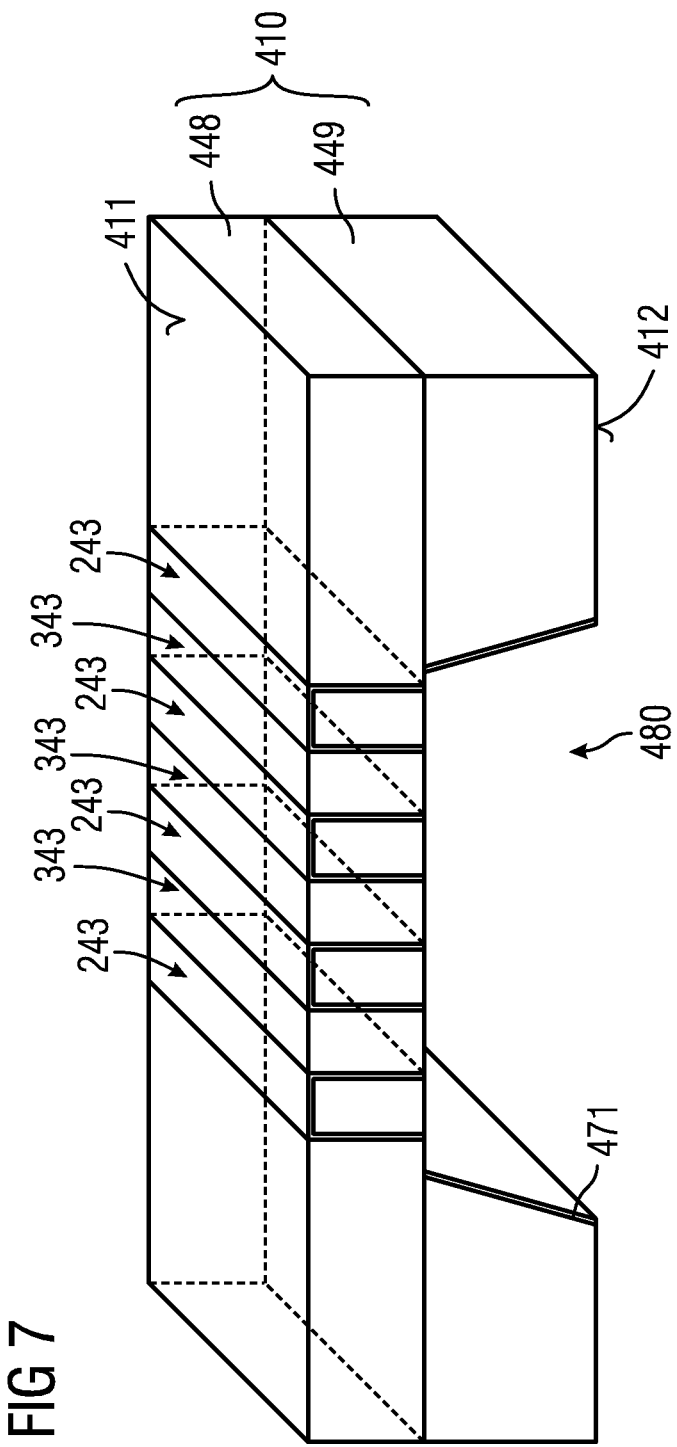

LATERAL POWER SEMICONDUCTOR DEVICE AND METHOD FOR MANUFACTURING A LATERAL POWER SEMICONDUCTOR DEVICE

TECHNICAL FIELD

Embodiments described herein relate to lateral power semiconductor devices with improved avalanche and commutation characteristics, and to methods for manufacturing a lateral power semiconductor device.

BACKGROUND

In comparison with vertical devices, lateral power semiconductor devices are suitable for small and medium currents since they do not need an edge termination region that consumes additional chip area. Currently, lateral power semiconductor devices are designed to maximize the rated total current for a given chip area. This may cause problems in regions where the electrical field is locally increased due to bending of the electrical field lines.

In view of the above, there is a need for improvement.

SUMMARY

According to an embodiment, a lateral power semiconductor device includes a semiconductor body having a first surface and a second surface opposite the first surface. A first main electrode having at least two sections is arranged on the first surface, and a second main electrode is arranged on the first surface between the two sections of the first main electrode. A plurality of switchable semiconductor cells is arranged between a respective one of the two sections of the first main electrode and the second main electrode and is configured to provide a controllable conductive path between the first main electrode and the second main electrode. At least one curved semiconductor portion is arranged between the first main electrode and the second main electrode with increasing doping concentration from the first main electrode to the second main electrode.

According to an embodiment, a lateral power semiconductor device includes a semiconductor body having a first surface, a semiconductor substrate and a semiconductor layer on the semiconductor substrate, and a loop structure having, from a top view on the first surface, at least one curved semiconductor portion and at least one straight semiconductor portion including a plurality of switchable semiconductor cells. Each switchable semiconductor cell includes a drift region formed in the semiconductor layer, a drift control region formed in the semiconductor layer adjacent to the drift region, and an accumulation dielectric electrically insulating the drift region from the drift control region. Insulating layers electrically insulate the drift control region of each switchable semiconductor cell from the semiconductor substrate. The curved semiconductor portion is formed in the semiconductor layer, and comprises an outer curved boundary partially surrounding an inner boundary from the top view on the first surface, wherein the doping concentration of the curved semiconductor portion increases from the outer curved boundary to the inner boundary.

According to an embodiment, a lateral power semiconductor device includes a semiconductor body having a first surface, a first doping region of a first conductivity type, a second doping region of a second conductivity type forming a pn-junction with the first doping region, a third doping region of the first conductivity type forming a main pn-junction with the second doping region, and a fourth doping region in contact with the third doping region, wherein the main pn-junction surrounds the third doping region from a top view on the first surface. The third doping region surrounds the fourth doping region in top view on the first surface. The third doping region includes straight semiconductor portions and curved semiconductor portions from the top view on the first surface. The doping concentration of the curved semiconductor portions increases from the main pn-junction to the fourth doping region.

According to an embodiment, a method for manufacturing a lateral power semiconductor device includes providing a semiconductor body having a semiconductor substrate and a semiconductor layer on the semiconductor substrate, the semiconductor layer forming a first surface of the semiconductor body; forming a loop structure in the first surface having, from a top view, at least one curved semiconductor portion and at least one straight semiconductor portion having a plurality of switchable semiconductor cells, each switchable semiconductor cell having a drift region formed in the semiconductor layer, a drift control region formed in the semiconductor layer adjacent to the drift region, and an accumulation dielectric electrically insulating the drift region from the drift control region; and forming insulating layers between the drift control region and the semiconductor substrate to electrically insulate the drift control region of each switchable semiconductor cell from the semiconductor substrate; wherein the curved semiconductor portion is formed in the semiconductor layer and comprises an outer curved boundary and an inner boundary from the top view on the first surface, wherein the doping concentration of the curved semiconductor portion increases from the outer curved boundary to the inner boundary.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 3 illustrates a vertical cross section through a curved semiconductor portion of a lateral power semiconductor device according to an embodiment;

FIGS. 4A and 4B illustrate electrical field distributions across regions of the lateral power semiconductor device;

FIGS. 5A to 5D illustrate switchable semiconductor cells of a lateral power semiconductor device according to an embodiment;

FIGS. 6A to 6D illustrate processes for manufacturing a lateral power semiconductor device according to an embodiment;

FIG. 7 illustrates a process for manufacturing a lateral power semiconductor device according to an embodiment;

DETAILED DESCRIPTION

In the following Detailed Description, reference is made to the accompanying drawings, which form a part hereof, and in which are shown by way of illustration specific embodiments in which the invention may be practised. In this regard, directional terminology, such as "top", "bottom", "front", "back", "leading", "trailing" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

The term "lateral" as used in this specification intends to describe an orientation parallel to the main surface of a semiconductor substrate.

The term "vertical" as used in this specification intends to describe an orientation, which is arranged perpendicular to the main surface of the semiconductor substrate.

In this specification, a second surface of a semiconductor substrate is considered to be formed by the lower or back-side surface while a first surface is considered to be formed by the upper, front or main surface of the semiconductor substrate. The terms "above" and "below" as used in this specification therefore describe a relative location of a structural feature to another structural feature with consideration of this orientation.

The terms "electrical connection" and "electrically connected" describes an ohmic connection between two elements.

Figure 1:
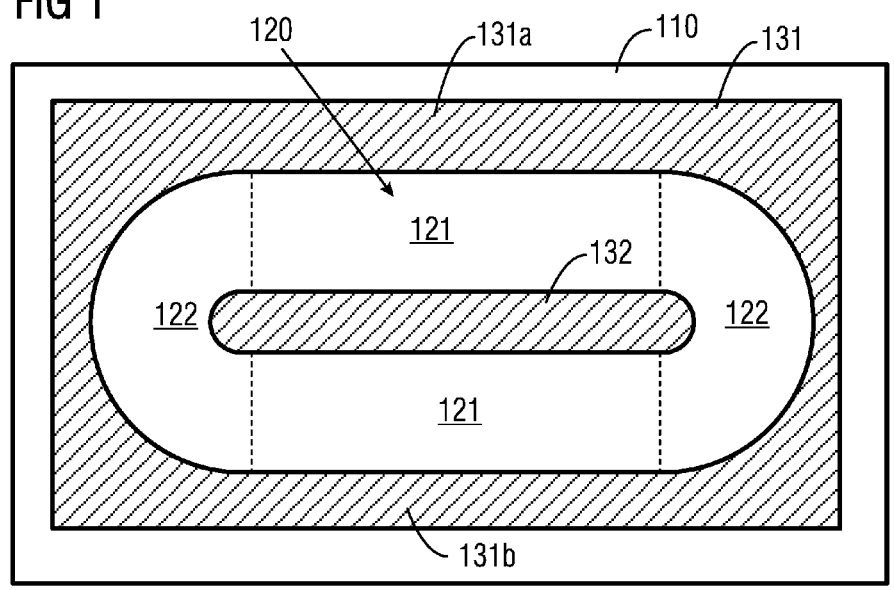
FIG. 1 illustrates a top view on a lateral power semiconductor device according to an embodiment.
Figure 2:
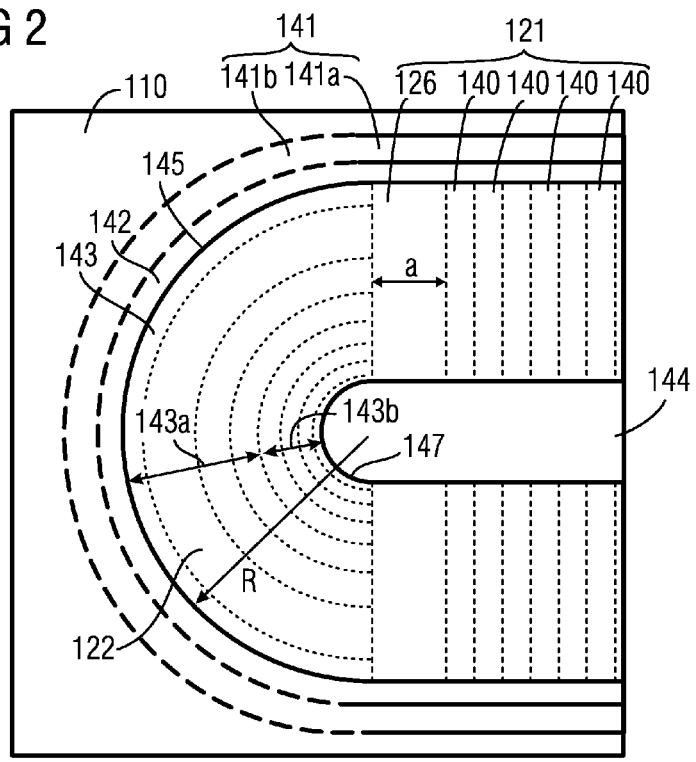
FIG. 2 illustrates an enlarged view of a portion of a lateral power semiconductor device according to an embodiment.

FIGS. 1-3 depict a lateral power semiconductor device according to an embodiment. FIG. 1 illustrates a top view on a first surface 111 (see FIG. 3) of a semiconductor body 110 of the lateral power semiconductor device. A first main electrode 131 and a second main electrode 132 are arranged on the first surface 111. The first main electrode 131 is disposed from, and surrounds, the second main electrode 132.

The first electrode 131 includes at least two straight sections 131a and 131b arranged on the first surface 111. The second main electrode 132 is arranged between the two straight sections 131a and 131b.

The first and second main electrodes 131, 132 are in electrical contact with respective doping regions that are arranged below the first and second main electrodes 131, 132 that are not shown in FIG. 1. FIG. 2, illustrating an enlarged section of FIG. 1 without the first and second main electrodes 131, 132, shows a first semiconductor region 141 which may be, for example a source region. The first semiconductor region 141 is of a first conductivity type, which may be, for example, n-type.

According to an embodiment, the first semiconductor region 141 may be at least partially omitted at the outer curved boundary. FIG. 2 shows the first semiconductor region 141 including first sections 141a forming straight regions and second sections 141b, in this case, forming curved regions each of which connects respective two of the first sections 141a. The first sections 141a can form the source regions of the cells of the lateral power semiconductor device. The second sections 141b are optional and do not need to be formed. The optional second sections 141b are marked by dashed lines. According to an embodiment and shown e.g., in FIG. 5A, in a part of the straight regions, e.g. in a doping region 126 as shown in FIG. 2 or at the end of drift control regions, the first semiconductor region 141 can be alternatively and/or additionally at least partially omitted. These regions where the doping of the semiconductor region 141 is omitted in the straight regions, for example between adjacent regions 241 in FIG. 5A, can be understood as belonging to the second sections 141b.

The first semiconductor region 141, when including the first and second sections 141a, 141b, completely surrounds a fourth semiconductor region 144, which may be of the first conductivity type to form a drain region, for example. When the first semiconductor region 141 includes only the first sections 141a, the fourth semiconductor region 144 is disposed between the first sections 141a of the first semiconductor region 141, as is the case when the first semiconductor region 141 completely surrounds the fourth semiconductor region 144. The fourth semiconductor region 144, which may form a drain region, is in electrical contact with the second main electrode 132, which is drain metallization in this embodiment. The first semiconductor region 141 is in electrical contact with the first main electrode 131, which is a source metallization in this embodiment.

Between the first main electrode 131 and the second main electrode 132 there is a closed loop structure 120 on the first surface 111 that includes straight semiconductor portions 121 and curved semiconductor portions 122, as best shown in FIG. 1. The closed loop structure 120 typically completely surrounds the fourth doping region 144.

The closed loop structure 120 is mainly formed by a third doping region 143 which may be of the first conductivity type. In the present embodiment, the third doping region 143 is weakly n-doped having a doping concentration that is less than the doping concentration of the fourth doping region 144. The third doping region 143 typically forms a drift region of the lateral power device. Adjacent to the third doping region 143 is a second doping region 142, of the second conductivity type, i.e. of p-type, that forms a body region. A main pn-junction 145 is formed between the second doping region 142 and the third doping region 143. The second doping region 142 is arranged between the first doping region 141, and the third doping region 143. The first doping region 141 region is arranged adjacent to the second doping region 142.

The main pn-junction 145 can be considered as forming an outer border or outer curved boundary of the closed loop structure 120, i.e., of the third doping region 143. The second doping region 142 and first doping region 141, although shown in FIG. 2 to form ring structures following the contour of the main pn-junction 145, can have shapes deviating from the course of the main pn-junction 145, for example in the curved semiconductor portions 122.

According to an embodiment, the first doping region 141 and/or the second doping region 142 may be formed by individual doping islands arranged substantially along the line of the main pn-junction 145 as shown in FIG. 2. In this case, the course of the main pn-junction 145 can show some deviations compared to FIG. 2, e.g., can include some wave-kind line. According to an embodiment, one or more of the first doping region 141 and/or second doping region 142 can be connected to the first main electrode 131.

For example, the third doping region 143 may be formed as a ring structure having two main straight sections, corresponding to the straight semiconductor portions 121, running parallel to each other and having the fourth doping region 144 disposed therebetween. Furthermore, the third doping region 143 may include two semi-ring sections that correspond to the curved semiconductor portions 122 and connect the straight sections so that the fourth doping region 144 is completely surrounded by the third doping region 143. The second doping region 142 may include two straight sections 121 between which the straight sections of the third doping region 143 are arranged. Along the outer boundary of the semi-ring sections 122 of the third doping region 143, islands of the second doping region 142 may be arranged. According to this embodiment, continuous pn-junctions 145 are formed between the straight sections 121 of the second doping region 142 and the third doping region 143. The pn-junction 145 along the outer boundary of the semi-ring sections of the third doping region 143 includes respective sections formed by a respective island of the second doped region 142 and the semi-ring sections 122 of the third doping region 143. The space between adjacent islands of the second doping regions 142 is such that this space is completely depleted in reverse mode of the power device.

When the second sections 141b of the first doping region 141 are present, these sections 141b can cause latching during commutation of the power device. To avoid latching, the second sections 141b may be omitted. Furthermore, when the second sections 141b of the first doping region 141 are present, a portion of the electron charge emanating from the fourth doping 144 forming a drain region is drained through the second sections 141b, as the second sections 141b form together with the second doping region 142 and the third doping region an npn-transistor. In this case, the surplus of charges in the semi-ring sections 122 of the third doping region 143 is beneficially lowered. Of the above described two processes, the process that dominates depends on the actual doping and/or geometrical relations. Thus, by appropriately selecting the doping relations and/or geometry of the structure, latching can be avoided even when the second sections 141b are formed to reduce the surplus of charges.

A junction between the third doping region 143 and the fourth doping region 144, for example an nn+-junction, may be considered to form an inner boundary 147 of the closed loop structure 120.

The geometrical arrangement of the first doping region 141 and the fourth doping region 144 is not limited to the embodiment shown herein. For example, each of the first and fourth doping region 141, 144 may have, when viewed onto the first surface 111, a fin-like shape wherein the fins of each doping region interdigitate with the fins of the other doping region. Irrespective of the actual geometry of the first doping region 141 and the second doping region 144, both regions remain spaced apart from each other with the closed loop structure 120 arranged between the first and second doping region 141, 144.

The closed loop structure 120 includes a plurality of switchable semiconductor cells 140 arranged in the straight semiconductor portions 121 between the first semiconductor region 141 and the fourth semiconductor region 144 as best shown in FIG. 2. The switchable semiconductor cells 140 are therefore also arranged between the first main electrode 131 and the second main electrode 132. The switchable semiconductor cells 140 provide a controllable conductive path between the first main electrode 131 and the second main electrode 132 as will be described further below.

As shown in FIG. 2, a doping region 126, which does not include switchable semiconductor cells, is arranged between the semiconductor cells 140 and the curved semiconductor portion 122 so that the curved semiconductor portion 122 is spaced from the semiconductor cells 140. The doping region 126 is part of the straight portion 121 in this embodiment.

The curved semiconductor portion 122 has a doping concentration increasing from the first main electrode 131 to the second main electrode 132. This is illustrated in FIG. 2 by the dashed half-circles with increased density towards the fourth doping region 144. The doping concentration of the curved semiconductor portion 122 can increase by a factor of about 1/R with R being the distance from an imaginary geometrical center arranged in the fourth doping region 144. According to an embodiment, the doping concentration in the curved semiconductor portion 122 may have a substantially stepwise characteristic with a lower doped part 143a and a higher doped part 143a.

In the present embodiment, the closed loop structure 120 surrounding the fourth doping region 144 includes at least two curved semiconductor portions 122 and at least two straight semiconductor portions 121 which comprise a plurality of switchable semiconductor cells 140. The number of the curved semiconductor portions 122 and the straight semiconductor portions 121 is, however, not limited to two and depends on the shape of the first and fourth doping region 141, 144. In case of fin-shaped first and fourth doping regions 141, 144, the number of the curved semiconductor portions 122 and the straight semiconductor portions 121 is larger than two. For example, when the fourth semiconductor region 144 has a substantially square-like shape with rounded edges, the closed loop structure includes four curved semiconductor portions 122 and four straight semiconductor portions 121.

The geometrical shape of the closed loop structure 120 of the present embodiment can be described as stadium having two straight semiconductor portions 121 which are arranged parallel to each other and which are connected by the substantially semi-circular curved semiconductor portions 122. The fourth doping region 144 is a rather elongated region with rounded edges, one of which is shown in FIG. 2.

The course of the electrical field during blocking state is mainly defined by the course of the main pn-junction 145, the outer shape of the fourth doping region 144, and the doping relation of the third doping region 143. Contrary to other approaches that place active cells into curved regions to maximize the total current of the lateral semiconductor device during the on-state, the present embodiment does not include active semiconductor cells in the curved semiconductor portions 122.

During blocking operation, there is a large voltage difference between the first doping region 141, or the second doping region 142 when the first doping region 141 does not include second sections 141b, and the fourth doping region 144, since the semiconductor cells 140 are in blocking state and do not provide a conductive path between the first doping region 141 and the fourth doping region 144. The first and second doping regions 141, 142 can be on the same electrical potential when both are electrically connected to the first main electrode 131. During static blocking operation, the maximum of the electric field is located at the main pn junction 145. The field lines of the electrical field between the second doping region 142, the semiconductor substrate (not shown in FIG. 2) and the fourth doping region 144 are three-dimensionally bent in the curved semiconductor regions 122. Thus, there is a local increase of the electrical field in the curved semiconductor regions 122 in comparison to the straight semiconductor regions 121. The shape and doping values of the third doping region 143 and the fourth doping region 144 may be further used to increase the electric field at the main pn-junction 145 in the curved semiconductor regions 122 in comparison to the straight semiconductor regions 121. Therefore, the value of the electric field when avalanche multiplication starts, is first reached in the curved semiconductor regions 122.

When avalanche occurs in the curved semiconductor region 122, for example close to the second semiconductor region 142, charge carriers are generated and separated by the electrical field. Assume that the fourth doping region 144 is on a higher electrical potential than the first doping region 141 and second doping region 142 during blocking mode. The third doping region 143 forms a drift region and is weakly n-doped. Since the absolute value of the electric field decreases proportionally to the charge in the space charge area, the slope of the field curve in the lower doped part 143a of the third doping region 143 is lesser as compared to the higher doped part 143b. Free electrons are generated in the third doping region 143 by the avalanche effect and move to the fourth doping region 144 on account of the prevailing electrical field between the fourth doping region 144 and the second doping region 142. Due to the geometrical effect of the curvature, the local exaggeration of the current density and thus the electron density is mainly close to the fourth doping region 144. This is beneficial particularly when the fourth doping region 144 forms a drain region. In this case, the local exaggeration of the electrical field is remote from the main pn-junction 145. Thus, an increased amount of electrons towards the fourth doping region 144 partially compensate the positive net charge of the donators in the n-doped third doping region 143 and fourth doping region 144. The reduction of the positive net charge results in a deviation of the electrical field in comparison to the case in which no current flows and an in which the electrical field distribution is only defined by the background doping distribution. These two cases are schematically illustrated in FIG. 4A, assuming a homogeneous electron current density. Taking into account the increasing electron current density and thus increasing negative charge density, the gradient of the electric field approaching the fourth doped region 144 decreases in a non-linear way.

The vertical dashed line in FIG. 4A indicates the location of the junction between the third doping region 143 and the fourth doping region 144. The solid line corresponds to the case where no current of generated electrons flows, i.e., where the electrical field is defined by the background doping p only, which is assumed to be constant in each of the respective doping regions 143a, 143b and which corresponds to the doping concentration $N_D^+$ of the donators. Due to a partial compensation by the electrons "accumulating" towards the junction between the third doping region 143a, 143b, the background doping is partially compensated so that the "effective" positive background doping ρ corresponds to the doping concentration $N_D^+$ of the donators plus the concentration of the electrons. Note that the charge of electrons is negative which leads to a reduction of ρ. The resulting electrical field distribution is indicated by the dashed line in FIG. 4A.

It should be noted here that the "accumulation" of electrons is a dynamic process. The density of the electrons is higher close to the fourth doping region 144 because electrons, which are generated in a greater distance from junction between the third and fourth doping region 143, 144, flow towards this junction. In addition, the geometrical effect of the bent electrical field causes the electrons to concentrate towards the curved junction between the third and the fourth doping region 143, 144. Hence, on average, the concentration of electrons is increased and remains increased during avalanche.

The reduced positive net charge results in a reduction of the slope of the electrical field as illustrated in FIG. 4A which shows that the grad(E) is slightly reduced. As a consequence, the blocking voltage increases. The maximum blocking voltage is provided when the electrical filed is constant (grad(E)= constant). In this case, the counter charge for the charge in the second doping region 142 is delivered in total by the high donator density of the fourth doping region 144 and lead to an almost abrupt reduction of the electric field. The increased blocking voltage in the curved semiconductor portion 122 in turn acts against the avalanche so that a self-stabilising effect is observed.

Assume that the current caused by avalanche increases. As a consequence, to maintain the blocking state, the voltage between the first and the fourth doping region 141, 144, which mainly drops over the third doping region 143, would also rise. This can lead to a situation where the maximum of the electrical field is close to or at the junction between the third and the fourth doping region 143, 144. In this case, the current-voltage-characteristics "snaps back," which eventually leads to a destruction of the lateral device.

To prevent this and to allow higher avalanche currents without destruction of the device, the background doping concentration of the curved semiconductor portions 122 can be raised. Furthermore, a doping concentration increasing towards the fourth doping region 144 further improves the avalanche robustness as an increasing doping concentration at least partially compensates the geometrical factor of the curved electrical field lines in the curved semiconductor region 122. For example, the doping concentration in the third doping region 143 can increase with 1/R with R being a distance from a geometrical center in the fourth doping region 144 close to the junction between the fourth doping region 144 and the third doping region 143.

According to a particular embodiment, the curved semiconductor portion 122 can have an outer boundary which is mainly defined by the main pn-junction 145. This outer boundary can be curved in general, for example or can be semi-circular as shown in FIG. 2. With reducing distance R from the geometrical center of this semi-circle, the doping concentration increases.

The curved semiconductor portion 122 can have an inner boundary defined by the junction between the third doping region 143 and the fourth doping region 144. The inner boundary may be curved, for example semi-circular, as shown in FIG. 2. The increasing doping concentration within the third doping region 143 may be adapted to follow the bending radius of the inner boundary. In the case of a semi-circular inner boundary as shown in FIG. 2, the bending radius is constant. In other cases, the bending radius may increase or decrease. The increase of the doping concentration in the third region 143 may then be adapted accordingly.

The increasing doping concentration results in an electric field distribution as indicated by the dashed line in FIG. 4B, which shows, as comparison, the electrical field distribution for a constant background doping (solid line) at the same blocking voltage applied between the second doping region 142 and the fourth doping region 144. The blocking voltage, i.e., the integral over the electric field strength, or in other words the onset of avalanche generation, can be reduced when locally increasing the background doping towards the junction between the third doping region 143 and the fourth doping region 144.

For illustration purposes only, the background doping of lateral device having a rated blocking voltage of 600 V is less than about $1.4*10^{14}/cm^3$. This doping concentration prevails also at the main pn-junction 145 in the curved semiconductor portions 122. The doping concentration increases towards the junction between the third doping region 143 and the fourth doping region 144 to a value of about $10^{15}$ to $10^{16}/cm^3$. Typically, the doping concentration increases from the main pn-junction 145 to the junction between the third doping region 143 and the fourth doping region 144 by a factor of about 5 to 100.

On account of the increased background doping concentration in the third doping region 143 in the curved semiconductor portion 122, the maximum permissible avalanche current increases. On the other hand, the blocking voltage at which avalanche occurs reduces. This is beneficial since the avalanche breakdown will occur in the curved semiconductor portions 122 and not in the switchable semiconductor cells 140. Furthermore, as described above, since the avalanche in the curved semiconductor portion 122 is self-stabilising, the lateral semiconductor device exhibits an improved avalanche robustness. The curved semiconductor portions 122 can therefore be referred to as "avalanche regions".

To ensure that the switchable semiconductor cells 140 forming the active region of the lateral semiconductor device, and the structures of the cells 140, for example oxide layers, are not influenced by the avalanche breakdown, the region 126 is provided between the curved semiconductor portion 122 and the switchable semiconductor cells 140 in the straight portion 121 as shown in FIG. 2. The lateral width "a" of the region 126 can be between about 5% to 100% of the distance in the straight semiconductor portions 121 between the second semiconductor region 142 and the fourth semiconductor region 144. The distance between the second semiconductor region 142 and the fourth semiconductor region 144 is depending on the desired blocking capability of a lateral semiconductor switch and may be estimated to be approximately 7.5 to 15 μm per 100V. For a device with a rated blocking voltage of 600V the distance between the second semiconductor region 142 and the fourth semiconductor region 144 should be in the range of about 45 μm to 90 μm and thus the value of "a" between about 2.25 μm and about 90 μm. The semiconductor region 126 has a doping concentration that is less than the doping concentration in the curved semiconductor portion 122 and can correspond to the background doping of the switchable semiconductor cells 140.

According to an embodiment, the peak doping concentration of the background doping within the third doping region 143 of the curved semiconductor portion 122 is spaced from the first surface 111, as shown in FIG. 3. FIG. 3 is a vertical cross section through the curved semiconductor portion 122 along the radius R shown in FIG. 2. In lateral direction, i.e., from the main pn-junction 145 to the junction between the third doping region 143 and the fourth doping region 144, the doping concentration increases, for example according to 1/R. The peak doping concentration for a given location X, however, is spaced from the first surface 111. The location of the peak doping concentration is indicated by the dashed line.

Such a doping profile can be obtained by implantation with an appropriately selected implantation energy which implants the dopants into a given depth which will later corresponds to the location of the peak doping concentration.

When the first main electrode 131 forms a source metallization and the second main electrode 132 a drain metallization, the outer rim of the lateral semiconductor device is at source potential while the center of the lateral semiconductor device is at drain potential. Control circuits for controlling the lateral semiconductor device can therefore be integrated into the semiconductor body 110 without additional level shifters. Furthermore, as shown in FIG. 3, the second doping region forming a body region can be in electrical continuity with a p-doped substrate 149 forming a lower part of the semiconductor body 110. This improves electrical insulation of the lateral semiconductor device, facilitates integration, and ensures that the rim and the lower side formed by a second surface 112 of the semiconductor body 110 is in the same electrical potential. According to an embodiment and not shown in FIG. 3, the electrical contact between the p-doped substrate 149 and the second doping region 142 may be done without continuous doping as shown in FIG. 3 but with other means like bond wires, soldered clips or other electrical connections outside the semiconductor body 110.

In a particular embodiment, the third doping region 143 in the curved semiconductor portion 122 forms a pn-junction with the p-doped substrate 149. This improves heat dissipation for the heat generated during avalanche.

Figure 5A:
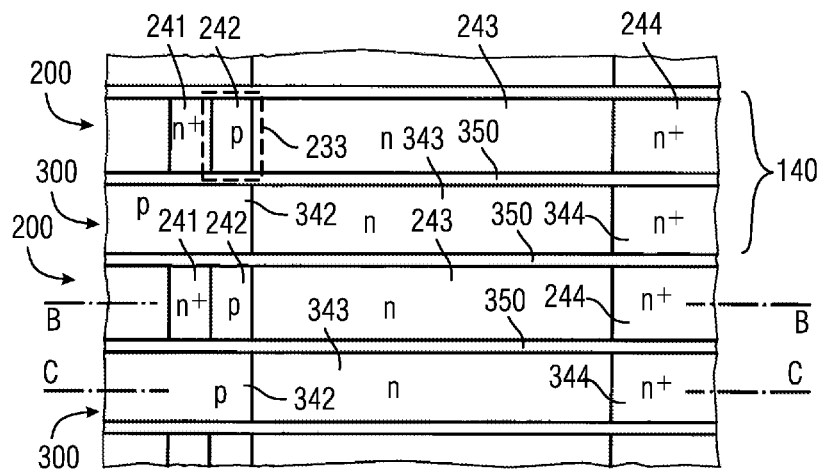

With respect to FIGS. 5A to 5D, the structure of the switchable semiconductor cells 140 according to an embodiment is described. The switchable semiconductor cells 140 are so-called TEDFETs in this embodiment and include two functional regions 200 and 300 as illustrated in FIG. 5A. Functional region 200 forms a "normal" FET while functional region 300 forms a drift control cell for forming and controlling an accumulation channel in the FET.

Figure 5B:
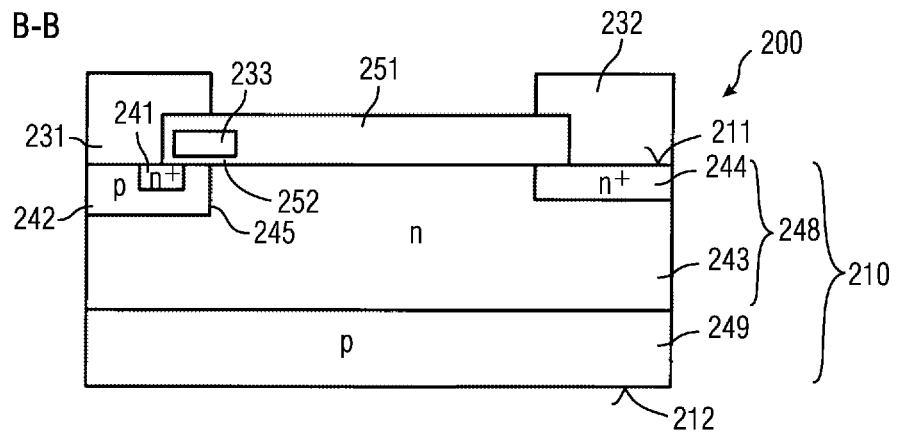

The structure of the FET (functional region 200) is illustrated in FIG. 5B showing a vertical section along line BB in FIG. 5A.

The FET cell is formed in a semiconductor body 210 including a semiconductor substrate 249 which may be, for example, p-doped and an n-doped semiconductor layer 248 formed on the semiconductor substrate 249. Semiconductor layer 248 can be formed using e.g., epitaxial growth. The n-doping of the semiconductor layer 248 forms the background doping of the switchable semiconductor cells 140. The semiconductor body 210 has a first surface 211 and a second surface 212 opposite the first surface 211. The semiconductor layer 248 extends to the first surface 211 and forms the third doping region 143 as described above, i.e., forms a drift region 243. A p-doped region 242, which is part of the second doping region 142, is formed in the drift region 243. The p-doped region 242 functions as a body region and forms the main pn-junction 245 with the drift region 243. A highly n-doped source region 241, being part of the first doping region 141, is embedded in the body region 242. A highly n-doped drain region 244, being part of the fourth doping region 144, is embedded in the drift region 243 and forms an nn+ junction with the drift region 243. A source metallization 231, being part of the first main electrode 131, is in electrical contact with source region 241 and the body region 241. Furthermore, a drain metallization 232, being part of the second main electrode 132, is in electrical contact with the drain region 244.

Above body region 242, and insulated therefrom by a gate dielectric 252, there is arranged a gate electrode 233 forming part of a third electrode of the lateral power semiconductor device. The gate electrode 233 and the drift region 243 are covered by a comparably thick insulation layer 251 insulating the gate electrode 233 and the drift region 243 against the source metallization 231 and the drain metallization 232.

The p-doped body 242 and p-doped semiconductor substrate 249 can be in electrical contact, for example by extending the body region 242 along an outer edge or rim of the semiconductor body 210 as shown in FIG. 3.

It should be noted that FIGS. 5A to 5D only show the structure of the switchable semiconductor cells 140 and not the complete device. The left side in FIGS. 5A to 5D faces to the outer rim of the semiconductor body 210 while the right side faces the center of the lateral semiconductor device defined by the fourth doping region 144.

Adjacent to the FET cell 200, there is formed a drift control cell 300 which is insulated from the FET cell 200 by an accumulation dielectric 350 as best shown in FIGS. 5A and 5C with FIG. 5C being a cross section along line CC in FIG. 5A.

The drift control cell 300 of the TEDFET is formed in the semiconductor body 310 having the first surface 311, the second surface 312, the semiconductor substrate 349, and the semiconductor layer 348 as described above. However, distal to the FET cell 200, an insulating layer 353 is formed between the p-doped semiconductor substrate 349 and the n-doped semiconductor layer 348. The semiconductor layer 348 can be formed using e.g., epitaxial growth. Together with the accumulation dielectric 350, the insulating layer 353 completely electrically insulates the drift control cell 300 from the adjacent FET cell 200 and the semiconductor substrate 349. This is best shown in FIG. 5D showing a three-dimensional illustration of a switchable semiconductor cell 140 including a FET cell 200 with an adjacent drift control cell 300.

The drift control cell 300 includes a p-doped first zone 342 and forming a main pn-junction 345 with a drift control region 343 formed by the n-doped semiconductor layer 348. A highly n-doped second zone 344 is formed in the semiconductor layer 348 and forms an nn+-junction with the drift control region 343. The first zone 342 is contacted by a first terminal 331 while the second zone 344 is contacted by a second terminal 332. The first terminal 331 can be electrically connected to the source metallization 231 through a not shown diode element. Similarly, the second terminal 332 can be electrically to the drain metallization 232 through a not shown diode.

According to an embodiment, the insulating layer 353 may also extend below the FET cell insulating the drift region 243 from the substrate 212. According to a further embodiment, the insulating layer 353 additionally or alternatively may also extend below the curved semiconductor portions 122 insulating the doping region 143 from the substrate 212. Insulating the drift region 243 and/or the doping region 143 inhibits the injection of carriers into the substrate 212 during operation of the body diode and thus may further improve the dynamic behaviour of the body diode. On the other hand, thermal performance is reduced due to the reduced heat flow through the insulating layer 353 compared to a direct contact of semiconductor material.

A comparably thick insulating layer 351, which may be continuous with the insulating layer 251, covers the drift control region 343 and provides insulation against the first and the second terminals 331, 332, respectively.

Due to action of the drift control region 343, an accumulation channel is formed in the drift region 243 along the accumulation dielectric 350 to reduce the on-state resistance in the conducting state of the lateral power semiconductor device.

As shown in FIG. 5A, the switchable semiconductor cells 140 are arranged adjacent to each other so that FET cells 200 and drift control cells 300 are alternatingly arranged in the straight semiconductor portion 121 of the lateral power semiconductor device.

As described above, avalanche breakdown is confined or restricted to the curved semiconductor portions 122 and, hence, does not influence the switchable semiconductor cells 140 and particularly the accumulation dielectric 350. Therefore, trapping of hot charge carriers, which are generated during avalanche breakdown, in the accumulation dielectric 350 can be significantly reduced. This effect is further improved when the peak doping concentration of the third doping region 143 in the curved semiconductor portion 122 is spaced from the first surface 111 as in this case the likelihood of hot carrier injected into the insulating layer 251, 351, which also covers the curved semiconductor portion 122, is also reduced.

The above described arrangement of the lateral power semiconductor device further exhibits an improved commutating characteristic so that the lateral power semiconductor device has improved avalanche robustness and an improved commutating characteristic.

During commutation, charge carriers stored in the device must be removed to bring the device into the blocking state. When the body-diode of the FET cells 200 is operating, as is the case for the structure shown in FIG. 5B, the drift region 243 is flooded with charge carriers. In the region of the switchable semiconductor cells 140, a large portion of the current is guided as channel current along the accumulation dielectric 350. Furthermore, the body-diodes, when suitably dimensioned to be able to handle large body diode currents, also causes the third doping region 143, corresponding to the drift region 243, to be flooded with charge carriers. When the device is now brought into the blocking state, the doping concentration in the curved semiconductor portion 122 increasing towards to the fourth doping region 144 acts as a field-stop region preventing the electrical field from quickly forwarding to the fourth doping region 144 (drain region 244). Hence, the charge carriers remain for a longer time in the third doping region 143 which leads to a more gentle commutation.

Furthermore, the current density for removing the positive charge carriers (holes) is reduced by the geometrical effect of the curved semiconductor portion 122 as the hole current is towards the outer boundary of the curved semiconductor portion 122. This leads to a higher switching robustness which is determined mainly by the hole current density. Such behavior is beneficial for bridge circuits and resonant applications, where the body diode can be subjected to hard commutation under specific conditions which may lead to a destruction of the device.

The above described lateral power semiconductor device allows the semiconductor body 110, i.e. the second side 112 of the semiconductor body 110, to be at the source potential. Furthermore, driving circuits can be easily integrated into the semiconductor body 110 laterally outside of the active regions of the power semiconductor device since the outer regions, as well as the backside of the semiconductor body 110, are on the same electrical potential.

Alternatively, the fourth semiconductor region 144 can be on source potential while the first and/or the second semiconductor region 141, 142 can be on drain potential.

In a further aspect, a reverse blocking transistor can be integrated in the regions of the switchable semiconductor cells 140, for example by forming an optional additional doping region 246 having a doping type opposite to the doping type of the drain regions 244 and which is electrically connected to the drain electrode 232 and isolates the drain region 244 from the drift region 243. The electrical connection in FIG. 5D is indicated by a line 247, but can be realized e.g., by a grooved contact for the drain electrode 232 or by the additional doping region 246 penetrating a part of the drain regions 244 reaching the first surface 211. Without applying a voltage to the drift control region 343, a lateral IGBT structure is thus provided that floods the drift region 243 when the gate 233 is charged. This results in a reduction of the drain voltage, and the voltage of the drift control region 343 is able to generate a continuous channel formed as accumulation channel in the drift region 243 and as inversion channel in the additional doping region 246. This modification improves the pulse current robustness of the lateral power semiconductor device. Furthermore, the reverse blocking capabilities are improved which drives the reverse current into the curved semiconductor portions 122 of the third doping region 143 having doping relations which are tailored, particularly due to the increasing doping concentration, for optimal diode performance. Furthermore, active rectifier operation of the lateral power semiconductor device is also possible by generating a conductive channel along the accumulation dielectric 350 and increasing the voltage applied to the gate electrode 233.

With reference to FIGS. 6A to 6D, a method for manufacturing a lateral power semiconductor device is described.

A semiconductor body 410 having a semiconductor substrate 449 and a semiconductor layer 448 on the semiconductor substrate 449 is provided. The semiconductor layer 448 can be an epitaxially grown layer of a doping type opposite to the doping type of the semiconductor substrate 449. In this case, the semiconductor layer 448 forms a pn-junction with the semiconductor substrate 449. The semiconductor layer 448 can also be of the same doping type as the semiconductor substrate 449.

The semiconductor layer 448 extends to and forms a first surface 411 of the semiconductor body 410 as illustrated in FIG. 6A.

In a further process, a plurality of trenches 460 is formed in the semiconductor layer 448. This is shown in the left part of FIG. 6A. The trenches 460 run along the regions where the drift control regions 343 are formed in subsequent processes. For each drift control region 343, a respective trench 460 can be formed. The mesa regions between adjacent trenches 460 form later the drift regions 243.

The trenches 460 can extend, in a top view as for example shown in FIG. 2, from a region above the main pn-junction 145 to below the main pn-junction 145 when referring to the orientation of FIG. 2. The trenches 460 therefore also extend through the region where later the fourth doping region 144 is formed. As shown in the embodiment of FIG. 2, the trenches 460 may extend along the semiconductor cells 140 from the upper edge of the semiconductor body 110 to the lower edge of the semiconductor body 110. As a plurality of lateral power semiconductor devices is formed on a wafer, the trenches 460 maybe formed to extend to regions which later form the edges of the lateral power semiconductor devices. Alternatively, the trenches 460 may extend to regions just outside of the first semiconductor region 141.

In a further process, as illustrated in the left part of FIG. 6B, the semiconductor body 410 is tempered at an elevated temperature in a deoxidizing atmosphere to cause surface migration of the semiconductor material of the semiconductor layer 448 until the trenches 460 are covered by the semiconductor material to form respective cavities 461 that are laterally spaced apart from each other. Since the "reflow" of the semiconductor material results in a mono-crystalline material, the extension of the trenches into other regions than the regions, where the drift control regions are formed, is uncritical.

As an illustrative example, the trenches 460 can have a lateral width of about 300 nm to about 3000 nm and a length of about 30 µm to about 120 µm for a device with 600V blocking capability. The minimal length of the trenches can correspond with the length $I_T$ of the lateral transistor cell which is connected to the desired blocking voltage $V_B$ of the lateral transistor. In an embodiment, the $I_T$ in µm is about 5 . . . 20*$V_B$/100V. However the trenches can be much longer than these values and can be formed reaching through one or more chips or even through the whole wafer. The above width changes in the tempering process and the initial width of the trenches 460 should be adapted to allow for this change. The pitch of the trenches 460 can be in the range of several hundred nm which reliably prevents that adjacent trenches 460 merge during the tempering process. The depth of the trenches 460 can be in the range of several µm. These dimensions are only illustrative and not limiting.

The process conditions during tempering can be adjusted according to specific needs. For illustration purposes, the temperature can be in a range from about 1000° C. to about 1150° C. when the semiconductor layer 448 is a silicon semiconductor. In this temperature range, the semiconductor material of the semiconductor layer 448 begins to "flow" and the trenches 460 start to get closed by the flowing material. On the other hand, the trenches 460 widen in their lower parts due to the flowing material. The trenches 460, however, are spaced apart from each other by a lateral distance which is sufficient that the widening trenches 460 in their lower parts do not merge.

The tempering can be carried out, according to an embodiment, in a deoxidizing atmosphere, for example in a hydrogen atmosphere at low pressure, for example at about 10 Torr (about $1.3 \cdot 10^3$ Pa). The duration of the tempering process can be varied and can be selected in view of the temperature. A typical tempering time at the desired tempering temperature is about 10 min.

In a further process, as illustrated in the left part of FIG. 6C, a vertical channel 462 is formed extending from the first surface 411 to provide an access to the cavities 461. According to an embodiment, one respective channel 462 can be formed to extend to one respective cavity 461. According to another embodiment, one channel 462 can provide access to two or more cavities 461.

The cavities 461, which assume the shape of hollow pipes in the left part of FIG. 6C, have internal surfaces. In a further process, as illustrated in the left part of FIG. 6D, the internal surfaces of the cavities 461 are oxidized to form respective insulating layers 470, which later form the insulating layers 353. The channels 462 provide the access for the oxidising atmosphere to diffuse into the cavities 461.

The channels 462 are typically formed in regions outside the active region of the power semiconductor device. For example, the channels 462 can be formed in the regions of the kerf or sawing frame along which the semiconductor body 410 is finally cut to separate the power semiconductor devices from each other.

The left parts of FIGS. 6A to 6D illustrate the formation of separate insulating layers 470, which are only formed in the regions below the drift control regions 343. In this case, the mesa regions between the trenches 460 remain in contact with the semiconductor substrate 449. For example, the trenches 460 may be formed to extend as far as the semiconductor substrate 449 so that the respective insulating layers 470 are formed in the interface region between the semiconductor substrate 449 and the semiconductor layer or semiconductor layer 448. The mesa regions that later form the drift regions can form respective pn-junctions with the semiconductor substrate 449. These pn-junctions insulate the drift regions from the semiconductor substrate 449.

Leaving the drift regions in contact with the semiconductor substrate 449 is beneficial for heat transfer from the lateral transistor cells to a heat sink, which is typically connected to the back side of the semiconductor substrate 449, as the semiconductor material of the drift regions (mesa regions) in continuous with the semiconductor substrate 449. To further improve heat transfer, the trenches 460 may only be formed in regions of the later straight semiconductor portions 121. In other regions such as the curved semiconductor portions 122 and, for example, below the fourth semiconductor region 144, no trenches 460 are formed so that the semiconductor material also remains continuous in these regions and portions, respectively.

In addition to improved heat transfer, the cavities 261, which remain hollow even after formation of the insulating layer 471, reduce the capacitive coupling of the drift control region 343 with the semiconductor substrate 449.

In a further embodiment, as illustrated in the right parts of the FIGS. 6A to 6D, a common insulating layer 471 is formed below the drift control regions 343 and the drift regions 243. A plurality of closely spaced trenches 465 is formed in the semiconductor layer 448. Whether a trench transforms to a single cavity or adjacent trenches merge to a common cavity depends on the lateral spacing, i.e. pitch, of the trenches. When arranging a plurality of closely spaced trenches 465 in an array, a cavity 466 is formed that has, in top view, the 2-dimensional extension of the array. The cavity 466 may have a plane shape as illustrated in FIG. 6B. For example, a rectangular array of closely spaced trenches 465 form a substantially rectangular cavity 466 with rounded corners (seen in top view) while a row of closely spaced trenches 465 forms a substantially elongated cavity. Therefore, by selecting the arrangement of the trenches 108, virtually any cavity arrangement and shape can be formed.

In further processes, as illustrated in the right parts of the FIGS. 6C and 6D, a vertical channel 467 is formed to provide access for an oxidising atmosphere to the cavity 466 to form an insulating layer 471 on the internal surfaces of the cavity 466. The channel 467 is typically formed in regions outside the active region of the power semiconductor device and can be sited arbitrarily in the region of the cavity 466. For example, the channel 467 can be formed in the regions of the kerf or sawing frame along which the semiconductor body 410 is finally cut to separate the power semiconductor devices from each other. Heat transfer from the lateral transistor to the heat sink is impaired by using a cavity also underneath the drift regions 243. However, the capacitive coupling between the drift regions 243 and the substrate 449 is reduced.

According to an embodiment, a compromise between thermal performance and capacitive coupling of the lateral transistor may be done by combining tubular cavities 461 only under the drift control regions 300, e.g., in an area closer to the source regions of the lateral device, and a two dimensional cavity 466 under both drift regions 200 and drift control regions 300, e.g., in an area closer to drain regions. In this case, the number of channels 462, 467 may be reduced down to one channel in total.

By placing the cavity 466 under the curved semiconductor regions it can be avoided that electrons or holes generated in diode operation of the lateral power semiconductor device or during avalanche can reach the semiconductor substrate and thus can reach other portions of the device.

In further processes, a plurality of switchable semiconductor cells 140 is formed as illustrated in FIGS. 5A to 5D. Each switchable semiconductor cell 140 includes a drift region 243 formed in the semiconductor layer 448, particularly in the mesa regions between the regions where the trenches 460 were formed. The drift control regions 343 are formed in the semiconductor layer 448 adjacent to the drift region 243 and above the insulating layers 470. The accumulation dielectrics 350 are formed between the drift region 243 and the drift control region 343, for example by etching thin trenches. The etching stops on the insulating layer 470. The thin trenches are subsequently filled with an insulating material.

The semiconductor cells 140 form a straight semiconductor portion 121 of the loop structure 120 having, in top view on the first surface, at least one curved semiconductor portion 122 and at least one straight semiconductor portion 121.

In a further process, the curved semiconductor portion 122 is doped so that the doping concentration of the curved semiconductor portion 122 increases from the outer curved boundary 145 to the inner boundary 147. This can be, for example, done using one or several implantation masks. To reduce the number of process steps, the doping of the curved semiconductor portion 122 can be done with ion implantation through windows of a mask and a subsequent annealing step to reach diffusion of the dopant. The maximum doping concentration can be reached without masking the ion implantation which can be done e.g., close to the inner boundary 147. On the way to the outer curved boundary 145, the density of the windows in the mask is reduced thus reducing the mean amount of doping atoms implanted into the semiconductor material per area. The minimum doping concentration can be reached by completely blocking the ion implantation, i.e., without opening windows in the mask. This process can be repeated one or more times. From the position of integration it is desirable to use ion implantation steps and masking steps which are anyway needed in the production of the semiconductor chip.

Figure 8:
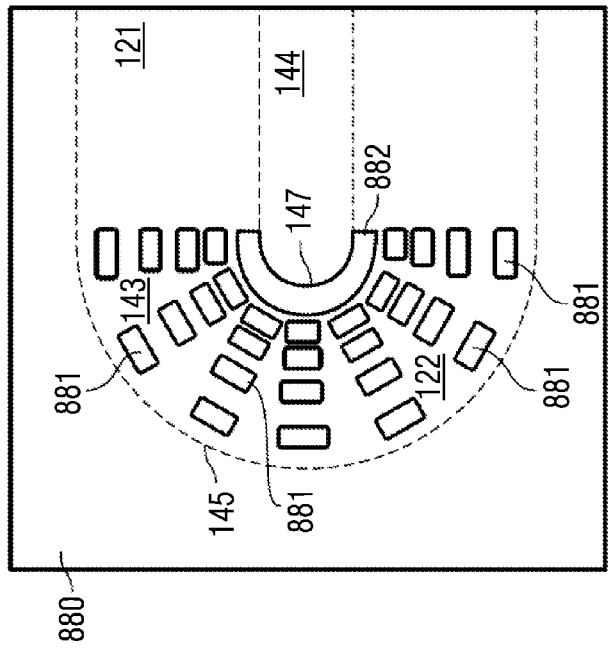
FIG. 8 illustrates a process for manufacturing a lateral power semiconductor device according to an embodiment.

An example is given in FIG. 8, which shows an implantation mask 880 having a plurality of windows 881 and 882. The dashed lines in FIG. 8 indicate the location of the outer boundary 145 and the inner boundary 147 of the curved portions 122 formed by portions of the third doping region 143. The number, size and shape of the windows 881 may vary, for example in radial direction while keeping the density constant in circumferential direction for a given radius. An inner window 882 can be formed as a semi-circular ring. By varying at least one of the number, size and shape of the windows 881, the implantation density can be locally adjusted. With a subsequent annealing step, the implanted dopants diffuse to smooth the implantation pattern defined by the mask 880. When using small-sized windows, the local variation of the resulting doping can be even better controlled and the duration and/or temperature of the subsequent annealing step can be reduced.

Figure 9A:
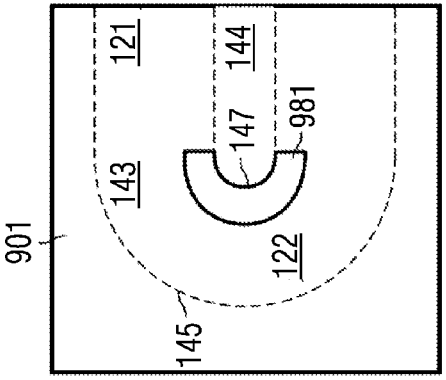
FIGS. 9A and 9B illustrate a process for manufacturing a lateral power semiconductor device according to an embodiment.
Figure 9B:
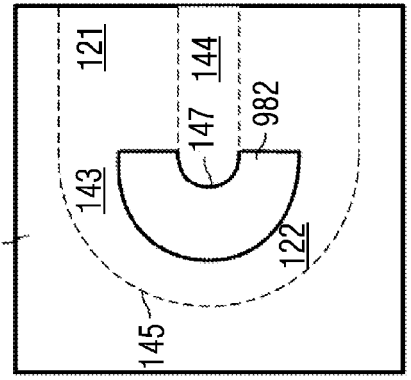

According to another embodiment, as illustrated in FIGS. 9A and 9B, a first mask 901 is provided covering an outer region of the curved semiconductor portion 122, for example region 143a shown in FIG. 2, and leaving an inner region of the curved semiconductor portion 122, for example region 143b, unmasked. The first mask 901 includes the first window 981. Dopants are implanted using the first mask 901 as doping mask. Then, a second mask 902 having a second window 982 is formed. The second window 982 leaves a portion of the outer region adjoining the inner region unmasked. According to an embodiment, the size of the second window 982 can be larger than the size of the first window 981 and extends further to the outer curved boundary 145. The second mask 902 is used as implantation mask during a further implantation process. Hence, by increasing the size of the second window 982 relative to the first window 981 towards the outer curved boundary 145, the total amount of dopants that are implanted into the curved semiconductor portion 122 is larger towards the inner boundary 147 than towards the outer boundary 145.

By using the first and second mask 901, 902, at least a two-step doping profile from the inner boundary 147 to the outer curved boundary 145 can be obtained. When using more than two masks, the number of steps in the doping profile may be increased.

The first and second masks 901, 902 may be portions of implantation masks which are used in other regions to form other doping regions such as the fourth doping region 144, an optional field-stop layer, or the first doping region 141. Hence, by appropriately combining implantation steps, the number of lithographic steps can be kept as small as possible.

According to several embodiments, the mask windows 881, 882, 981 and 982 shown in FIG. 8, FIGS. 9A and 9B can be permutated in all combinations. As an example windows like e.g., 881 may be used also in the first mask 901 and/or the second mask 902 additionally or alternatively to a bigger window 981, 982. The second mask 902 and the first mask 901 can have overlapping windows like window 981 and window 982 shown in FIGS. 9A and 9B. However, the window of the second mask 902 may be located only over masked areas of the first mask 901. Of course, more than two masks can be used.

With reference to FIG. 7, a further embodiment for manufacturing a lateral power semiconductor device is described. In this embodiment, the drift regions and the drift control regions are formed in a membrane of the semiconductor body 410. The insulation to the backside can be provided by a hollow recess and/or an insulating layer formed in the recess. This avoids, in diode operation of the lateral power semiconductor device, the electron-hole pairs generated during avalanche from reaching the semiconductor substrate and reaching other portions of the device.

As illustrated in FIG. 7, a recess 480 is formed, for example etched, in the second surface 412 of the semiconductor body 410. The recess 480 extends bottom regions of the drift control regions 343 and the drift regions 243.

In a further process, an insulating layer 471 may be formed on exposed surface of the recess 480. The remaining space of the recess can be left unfilled or can be filled by a material, such as a semiconductor material or an insulator like e.g., ceramics or a polymer which may include other particles, even metal, which improves heat dissipation. When leaving the recess 480 unfilled, the empty recess provides the insulation even without any extra insulating layer. Hence, the empty recess 480 can form an insulating layer.

As shown in FIG. 7, the insulating layer 471 and/or the recess 480 insulates the drift regions 243 and the drift control regions 343 from any further material which can later be formed on the second side 412 of the semiconductor body 410.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A lateral power semiconductor device, comprising:
   a semiconductor body having a first surface and a second surface opposite the first surface;
   a first main electrode comprising at least two sections arranged on the first surface;
   a second main electrode arranged on the first surface and between the two sections of the first main electrode;
   a plurality of switchable semiconductor cells arranged between a respective one of the two sections of the first main electrode and the second main electrode and configured to provide a controllable conductive path between the first main electrode and the second main electrode; and
   at least one curved semiconductor portion between the first main electrode and the second main electrode with increasing doping concentration from the first main electrode to the second main electrode.

2. The lateral power semiconductor device according to claim 1, wherein, in a cross-section perpendicular to the first surface, for any location in the curved semiconductor portion between the first main electrode and the second main electrode, a peak in the doping concentration is away from the first surface.

3. The lateral power semiconductor device according to claim 1, wherein the curved semiconductor portion and the plurality of switchable semiconductor cells form a closed loop structure surrounding the second main electrode.

4. The lateral power semiconductor device according to claim 3, wherein the closed loop structure comprises at least two curved semiconductor portions and at least two straight semiconductor portions, each of the straight semiconductor portions comprising a plurality of switchable semiconductor cells.

5. The lateral power semiconductor device according to claim 1, further comprising a doping region having a doping concentration lower than the doping concentration of the curved semiconductor portion, the doping region arranged between the curved semiconductor portion and the plurality of switchable semiconductor cells.

6. The lateral power semiconductor device according to claim 1, wherein each switchable semiconductor cell comprises a drift region, a drift control region adjacent to the drift region, and an accumulation dielectric between the drift region and the drift control region.

7. The lateral power semiconductor device according to claim 6, wherein the semiconductor body comprises a semiconductor substrate of one conductivity type and a semiconductor layer of an opposite conductivity type on and in contact with the semiconductor substrate, wherein the drift control region of each switchable semiconductor cells is formed in the semiconductor layer and is electrically insulated from the semiconductor substrate by a respective insulating layer.

8. The lateral power semiconductor device according to claim 7, wherein the drift region of each switchable semiconductor cell is formed in the semiconductor layer and forms a pn-junction with the semiconductor substrate.

9. The lateral power semiconductor device according to claim 6, wherein the semiconductor body comprises a semiconductor substrate, a semiconductor layer on the semiconductor substrate, and an insulating layer at least between sections of the semiconductor substrate and the semiconductor layer, and wherein the drift control region of each switchable semiconductor cells is formed in the semiconductor layer and is electrically insulated from the semiconductor substrate by the insulating layer.

10. The lateral power semiconductor device according to claim 1, wherein each switchable semiconductor cell comprises a drain region in electrical contact with the second main electrode.

11. The lateral power semiconductor device according to claim 1, wherein each switchable semiconductor cell comprises a source region in electrical contact with the first main electrode.

12. The lateral power semiconductor device according to claim 1, further comprising a fourth doping region in electrical contact with the second main electrode, a third doping region of a first conductivity type surrounding the fourth doping region and forming a junction with the fourth doping region, a second doping region of a second conductivity type surrounding the third doping region and forming a main pn-junction with the third doping region, and a first doping region of the first conductivity type in electrical contact with the first main electrode.

13. The lateral power semiconductor device according to claim 12, wherein the curved semiconductor portion is formed by a portion of the third doping region and has, from a top view on the first surface, a curved outer boundary defined by the main pn-junction and an inner curved boundary defined by the junction between the third doping region and the fourth doping region, and wherein the doping concentration of the curved semiconductor portion increases from the outer boundary to the inner boundary by about 1/R, wherein R is the distance from a center point arranged in the fourth doping region.

14. A lateral power semiconductor device, comprising:
a semiconductor body comprising a first surface, a semiconductor substrate and a semiconductor layer on the semiconductor substrate;
a loop structure comprising, from a top view on the first surface, at least one curved semiconductor portion and at least one straight semiconductor portion comprising a plurality of switchable semiconductor cells, each switchable semiconductor cell comprising a drift region formed in the semiconductor layer, a drift control region formed in the semiconductor layer adjacent to the drift region, and an accumulation dielectric electrically insulating the drift region from the drift control region; and
insulating layers electrically insulating the drift control region of each switchable semiconductor cell from the semiconductor substrate; and
wherein the curved semiconductor portion is formed in the semiconductor layer, and comprises an outer curved boundary partially surrounding an inner boundary from the top view on the first surface, and wherein the doping concentration of the curved semiconductor portion increases from the outer curved boundary to the inner boundary.

15. The lateral power semiconductor device according to claim 14, wherein the curved semiconductor portion forms a pn-junction with the semiconductor substrate.

16. The lateral power semiconductor device according to claim 14, further comprising a main pn-junction surrounding the loop structure from the top view on the first surface.

17. The lateral power semiconductor device according to claim 14, wherein, in a cross-sectional view perpendicular to the first surface, for a given location in the curved semiconductor portion between the outer curved boundary and the inner boundary of the curved semiconductor portion, a peak in the doping concentration is away from from the first surface.

18. A lateral power semiconductor device, comprising:
a semiconductor body comprising a first surface;
a first doping region of a first conductivity type, a second doping region of a second conductivity type forming a pn-junction with the first doping region, a third doping region of the first conductivity type forming a main pn-junction with the second doping region, and a fourth doping region in contact with the third doping region;
the main pn-junction surrounding the third doping region from a top view on the first surface;
the third doping region surrounding the fourth doping region from the top view on the first surface; and
the third doping region comprising straight semiconductor portions and curved semiconductor portions from the top view on the first surface, wherein the doping concentration of the curved semiconductor portions increases from the main pn-junction to the fourth doping region.

19. The lateral power semiconductor device according to claim 18, further comprising a doping region and a plurality of switchable semiconductor cells arranged in the straight portions of the third doping region, the doping regions having a doping concentration lower than the doping concentration of the curved semiconductor portion and arranged between the curved semiconductor portion and the switchable semiconductor cells.

20. The lateral power semiconductor device according to claim 18, wherein the doping concentration of the curved semiconductor portion increases, at least in sections, from the main pn-junction to the fourth doping region by about 1/R, wherein R is a distance from a center point arranged in the fourth doping region.

21. A method for manufacturing a lateral power semiconductor device, comprising:
providing a semiconductor body comprising a semiconductor substrate and a semiconductor layer on the semiconductor substrate, the semiconductor layer forming a first surface of the semiconductor body;
forming a loop structure in the first surface, comprising, from a top view on the first surface, at least one curved semiconductor portion and at least one straight semiconductor portion comprising a plurality of switchable semiconductor cells, each switchable semiconductor cell comprising a drift region formed in the semiconductor layer, a drift control region formed in the semiconductor layer adjacent to the drift region, and an accumulation dielectric electrically insulating the drift region from the drift control region; and
forming insulating layers between the drift control region and the semiconductor substrate to electrically insulate the drift control region of each switchable semiconductor cell from the semiconductor substrate;
wherein the curved semiconductor portion is formed in the semiconductor layer and comprises an outer curved boundary and an inner boundary from the top view on the first surface, and wherein the doping concentration of the curved semiconductor portion increases from the outer curved boundary to the inner boundary.

22. The method of claim 21, wherein the semiconductor layer is an epitaxial layer, and wherein forming the insulating layers comprises:
forming a plurality of trenches in the epitaxial layer;
tempering the semiconductor body at an elevated temperature in a deoxidizing atmosphere to cause surface migration of semiconductor material of the epitaxial layer until the trenches are covered by the semiconductor material to form respective cavities that are laterally spaced apart from each other and that comprise surfaces;

oxidizing the surfaces of the cavities to form the insulating layers.

23. The method of claim 21, wherein the semiconductor layer is an epitaxial layer, and wherein a common insulating layer is formed between the drift region and the semiconductor substrate and between the drift control region and the semiconductor substrate, the method further comprising:

forming a plurality of closely spaced trenches in the epitaxial layer;

tempering the semiconductor body at an elevated temperature in a deoxidizing atmosphere to cause surface migration of semiconductor material of the epitaxial layer until the closely spaced trenches coalesce to a single cavity that is covered by the semiconductor material of the epitaxial layer;

oxidizing a surface of the single cavity to form the insulating layers.

24. The method of claim 21, wherein forming the insulating layers comprises:

forming a recess in a second surface of the semiconductor body which recess extends up to the drift control regions and the drift regions.

25. The method of claim 24, further comprising forming an insulating layer in the recess.

26. The method of claim 21, wherein forming the curved semiconductor portion comprises:

providing a mask comprising a plurality of windows on the first surface of the semiconductor body, at least one of a size, number, and shape of the plurality of windows varying from the inner boundary to the outer curved boundary;

implanting dopants into the semiconductor layer; and annealing the semiconductor layer to diffuse the implanted dopants.

27. The method of claim 21, wherein forming the curved semiconductor portion comprises:

providing a first mask having a first window leaving an inner portion of the curved semiconductor portion adjacent to the inner boundary unmasked;

implanting dopants using the first mask as an implantation mask;

providing a second mask having a second window that extends more to the outer boundary of the curved semiconductor portion relative to the first window of the first mask, the second mask leaving a further portion of the curved semiconductor portion adjacent to the inner portion of the curved semiconductor portion unmasked;

implanting dopants using the second mask as an implantation mask;

annealing the semiconductor layer to diffuse the implanted dopants.

* * * * *

UNITED STATES PATENT AND TRADEMARK OFFICE
CERTIFICATE OF CORRECTION

PATENT NO. : 9,202,910 B2  
APPLICATION NO. : 13/873994  
DATED : December 1, 2015  
INVENTOR(S) : A. Mauder et al.

It is certified that error appears in the above-identified patent and that said Letters Patent is hereby corrected as shown below:

In the claims

Column 18, line 51 (claim 7) please change "cells is" to -- cell is --  
Column 18, line 65 (claim 9) please change "cells is" to -- cell is --  
Column 19, line 66 (claim 17) please change "away from from the" to -- away from the --  
Column 20, lines 17, 18 (claim 18) please change "portions increases" to -- portion increases --

Signed and Sealed this  
Twenty-second Day of March, 2016

Michelle K. Lee  
*Director of the United States Patent and Trademark Office*